United States Patent [19]

Kash et al.

[11] Patent Number: 4,626,883

[45] Date of Patent: Dec. 2, 1986

[54] TEXTURED CRYSTAL PICOSECOND PHOTORESPONSIVE ELEMENT

[75] Inventors: Jeffrey A. Kash, Pleasantville; Thomas F. Kuech, Ossining, both of N.Y.

[73] Assignee: International Business Machines Corporation, Armonk, N.Y.

[21] Appl. No.: 749,609

[22] Filed: Jun. 27, 1985

[51] Int. Cl.$^4$ .................. H01L 27/14; H01L 31/00
[52] U.S. Cl. ..................... 357/30; 148/DIG. 150; 357/4; 357/60
[58] Field of Search ............ 357/60, 30, 4, 59; 148/DIG. 150, DIG. 110; 29/572

[56] References Cited

U.S. PATENT DOCUMENTS

| | | | |
|---|---|---|---|
| 4,113,531 | 9/1978 | Zanio et al. | 357/30 |
| 4,368,098 | 1/1983 | Manasevit | 156/606 |
| 4,404,265 | 9/1983 | Manasevit | 428/689 |

FOREIGN PATENT DOCUMENTS

| | | |
|---|---|---|
| 56-56643 | 4/1981 | Japan . |
| 56-79992 | 5/1981 | Japan . |
| 56-2950 | 11/1981 | Japan . |

OTHER PUBLICATIONS

"Picosecond Photoconductivity in Polycrystalline CdTe Films Prepared by UV Enhanced OMCVD" by A. M. Johnson et al., *Technical Paper* presented at the Topical Meeting on Picosecond Electronics and Optoelectronics, Mar. 13–15, 1985, Incline Village, Nevada (FB3-1 and FB3-2).

*IBM Technical Disclosure Bulletin*, vol. 27, No. 3, Aug. 1984, p. 1621, "Photoconducting Pulse Generator of GaAs with Picosecond Response" by J. A. Kash.

*Appl. Phys. Lett.* 45(3), Aug. 1, 1984, p. 289, "Observed Circuit Limits to Time Resolution in Correlation Measurements with Si-on-Sapphire, GaAs, and InP Picosecond Photoconductors" by R. B. Hammond et al.

*IEEE Journal of Quantum Electronics*, vol. QE-19, No. 4, Apr. 1983, p. 639, "Impulse Response of Photoconductors in Transmission Lines" by D. H. Auston.

*Primary Examiner*—James W. Davie
*Assistant Examiner*—Georgia Y. Epps
*Attorney, Agent, or Firm*—Alvin J. Riddles

[57] ABSTRACT

Picosecond response photoconductors and photoresponsive elements can be provided that retain high carrier mobility and yet have short lifetime by providing on a crystal mismatched substrate a textured layer of domain regions wherein the domain size is such that the lifetime is proportional to the square of the size divided by the diffusion coefficient of the semiconductor material. The crystalline orientation in the domains with respect to the substrate is maintained. An embodiment is an approximately 0.1 micron thick textured layer of <111> GaAs grown on a <0001> hexagonal monocrystalline Al$_2$O$_3$ having domains approximately 1.0 micron with a carrier lifetime about 5 picoseconds and a carrier mobility of about 80 cm$^2$ volt$^{-1}$ sec$^{-1}$.

10 Claims, 3 Drawing Figures

TEXTURED CRYSTAL PICOSECOND PHOTORESPONSIVE ELEMENT

DESCRIPTION

1. Technical Field

Photoconductors or photoresponsive elements that operate in the $10^{-12}$ or picosecond range are under study for use in a number of applications in electronics and optoelectronics. Such applications may include as examples electronic switching and gating, sampling, waveform generation, microwave modulation, optical detection, x-ray and particle detection, device responsiveness testing, radio frequency mixing, and analog-to-digital conversion.

The photoconductor is made of a semiconductor but in general, high carrier mobility in a semiconductor is accompanied by a carrier lifetime that is longer than the desired response time of the photoconductor.

As the art has developed, most structures heretofore have employed an optically sensitive semiconductor on which there is performed steps to reduce the lifetime. These steps include radiation damage, amorphatization and the introduction of deep level compensating impurities.

2. Background Art

Recently in the art a polycrystalline film was fabricated to serve as a picosecond photoconductor wherein grain size was employed to reduce the lifetime. This work was reported by A. M. Johnson, D. W. Kisker and W. M. Simpson of AT&T Bell Laboratories in a Meeting on Picosecond Electronics and Optoelectronics, Mar. 13-15, 1985 at Incline Village, Nevada. The photoconducting material was CdTe on substrates of GaAs, Si and fused silica.

DISCLOSURE OF THE INVENTION

In accordance with the invention, applicants provide a crystal structure where the high mobility is retained by having the crystal periodicity be undisturbed and the lifetime is reduced by introducing boundaries around sized increments in the direction parallel with the device surface. This is achieved by providing a textured crystal layer on the substrate.

Further in accordance with the invention, a high responsiveness picosecond or shorter photoresponsive element is fabricated of a crystal made up of a thin textured high optical sensitivity semiconductor layer on an insulating substrate with a crystal spacing mismatch and where the carrier mobility is retained by maintaining the substrate crystalline structure in incremental portions or domains of the semiconductor layer. The carriers are trapped and recombine at the domain boundaries; therefore, the required domain size is governed by the desired carrier lifetime and the diffusion constant in the semiconductor material of the film.

The transport properties of the semiconductor material are retained by maintaining crystalline periodicity and hence carrier mobility in the individual crystalline incremental portions or domains in the textured structure yet limiting the lifetime by limiting the sizes of the domains by varying the thickness and growth parameters.

The domain size is related to the carrier lifetime in accordance with the expression in Equation 1.

$$\tau \approx S^2/D \qquad \text{Eq. 1}$$

where $\tau$—is the carrier lifetime in the semiconductor material

S—is the typical domain distance between boundaries in the azimuth direction, and D—is the diffusion constant of carriers in the semiconductor material Thus, for a textured layer of GaAs on $Al_2O_3$, D would be approximately 10 cm²/sec, so for a desired carrier lifetime $\tau$ of 10 picoseconds, the required domain size would be approximately 0.1 micron.

The domains are smaller than the distance a carrier would diffuse during the carrier lifetime of the semiconductor material in bulk single crystalline form.

Figure 1:
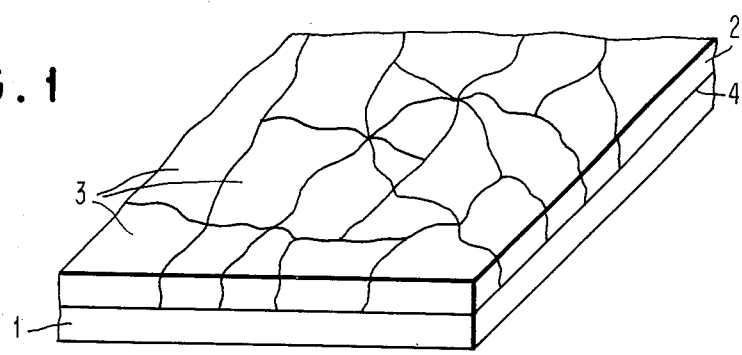
FIG. 1 is a perspective view of the crystallographic relationships in the textured crystal picosecond photoconductor of the invention.

Referring to FIG. 1 an illustration is provided of the photoresponsive element with the textured crystal photoresponsive layer wherein on a monocrystalline substrate 1, there is positioned a layer of a photosensitive semiconductor 2 made up of individual domains 3 having in each domain the crystalline orientation of the substrate 1. The size of each domain in the direction parallel to the interface 4 is related to the lifetime and diffusion length of the semiconductor material by the relationship in Equation 1.

The photoresponsive structure of the invention retains the photosensitivity benefits and the high carrier mobility of the monocrystalline materials while achieving a reduced carrier lifetime needed to be compatible with the desired optical signal response times.

The advantages of the invention can be appreciated from the fact that the carrier lifetime $\tau$ in bulk crystalline GaAs is approximately $1 \times 10^{-9}$ seconds whereas in the textured film of the invention where S and the thickness are approximately 0.1 micron, the carrier lifetime $\tau$ is about $4 \times 10^{-12}$ seconds. Such performance provides sensitivity of 10 to 100 times greater than heretofore in the art where lifetime was controlled by subsequent steps such as damage and, since the useful signal from these devices increases as the square of the sensitivity an enhancement in signal to noise of up to 10,000 may be achieved.

The semiconductor material 2 is selected for its optical sensitivity and GaAs is the preferred material at this point in time.

The layer 2 when grown on the mismatched substrate 1 has domains 3 that control the lifetime but which become larger as the layer becomes thicker. A thickness range for the layer 2 for best performance would be from 0.100 to 2.0 microns which results in domain sizes of 0.1 to 1 micron.

The substrate 1 should be monocrystalline, insulating and have a lattice parameter mismatch sufficient to produce the domains 3. High purity sapphire $Al_2O_3$ for a GaAs layer 2 is the preferred material at this point in time.

The structure of FIG. 1 is produced by growing, in standard metal organic chemical vapor deposition (MOCVD) apparatus, on a sapphire ($Al_2O_3$) substrate 1 crystallographically oriented <0001> perpendicular to the deposition surface. The substrates are degreased before loading into the reactor. They are thermally annealed at the growth temperature of 600° to 800° C. after loading into the reactor. All layers are grown by the reaction of trimethylgallium (Ga(CH$_3$)$_3$) and arsine (AsH$_3$) in a hydrogen carrier gas at a growth temperature range of 600° to 800° C. The growth rate is 0.05 microns per minute. The reactor pressure is 78 Torr. The mole fraction of trimethyl gallium (TMG) corresponding to the growth rate is $X_{(TMG)} = 1.9 \times 10^{-4}$. The AsH$_3$ to TMG which in turn controls the Group III/Group V element ratio for the III/V GaAs layer = 80. The AsH$_3$ mole fraction of $X_{arsine} = 1.5 \times 10^{-2}$. The linear flow rate of the gas in the reactor is of the order of 30 centimeters per second in a 75 millimeter diameter tube. The layer 2 is grown to an average thickness of 0.1 to 2 microns.

Figure 2:
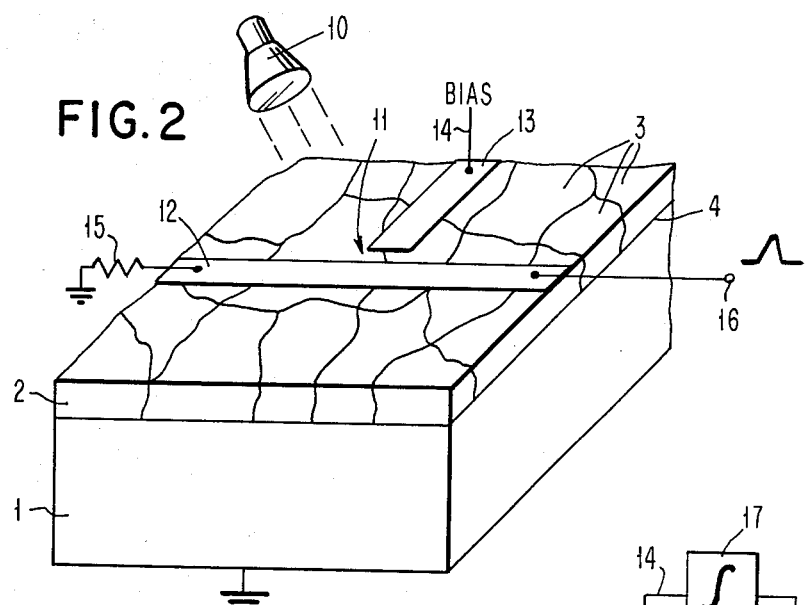
FIG. 2 is a perspective view of a picosecond photoconductive pulse generator employing the invention.
Figure 3:
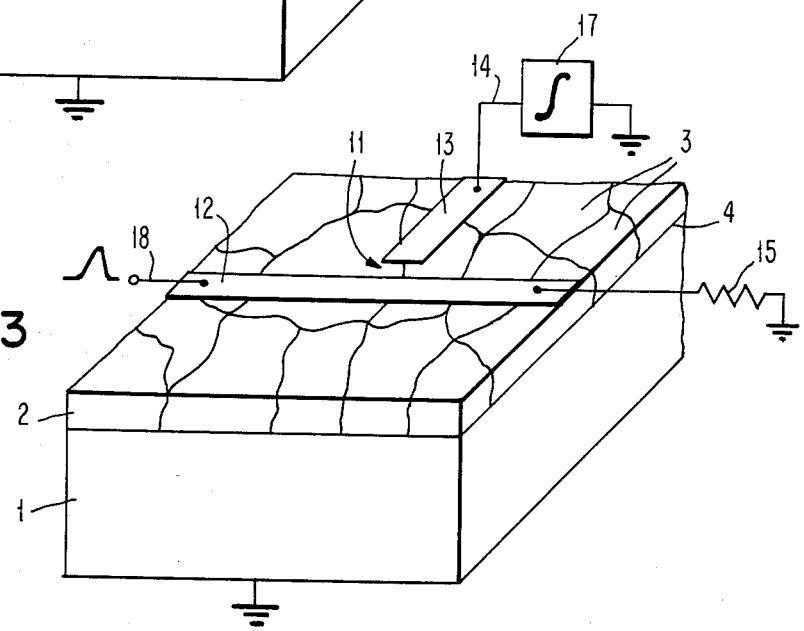
FIG. 3 is a perspective view of a picosecond pulse sensor employing the invention.

Referring next to FIGS. 2 and 3, there are shown perspective views of an example apparatus that illustrate the signal generating and signal sensing principles employed in connection with the invention.

In FIG. 2 the principles are set forth for the conversion of an optical signal to an electrical signal. In FIG. 2 the reference numerals of the textured crystal are the same as in FIG. 1. The signal provided optically from element 10, such as a laser providing light with a photon energy greater than the band gap of the layer 2, is sensed at the gap 11, which is about 10 microns wide, between a signal transmission line member shown as a stripline 12 and a branch transmission line member shown as a stripline 13 connected to a source of bias of approximately 10.0 volts at a connector 14. The signal stripline is terminated to ground through a signal transfer terminating impedance standard in the art and shown as a resistive element 15. The output signal is provided at connection 16. The materials used for the striplines 12 and 13 should provide ohmic contact with the material of the semiconductor used for the textured layer 2. An ohmic connection to ground is made over the area of the substrate 1 opposite to the layer 2.

In FIG. 3 the principles are set forth for signal sensing in which the reference numerals for identical elements are maintained. In the sensing in FIG. 3, the principal difference over the structure of FIG. 2 is that a charge integrator 17 standard in the art is connected between connector 14 and ground to integrate the charge produced at the gap 11 when a signal is impressed on the stripline 12 at terminal 18.

While the example pulse generator and pulse sensor devices employ stripline technology, it will be apparent to one skilled in the art that other transmission line geometries will be satisfactory.

BEST MODE FOR CARRYING OUT THE INVENTION

The preferred structure employs a sapphire (Al$_2$O$_3$) substrate 1 with a GaAs textured layer 2. The substrate is oriented <0001> perpendicular to the surface of layer 2. The textured GaAs layer is oriented <111> perpendicular to the layer 2 face and is 0.1 micron thick.

In this structure the lifetime is about 5 picoseconds and the mobility is about 80 cm$^2$ volt$^{-1}$ sec$^{-1}$.

What has been described is a technique of retaining photoconductive sensitivity in a semiconductor element while providing a shortened lifetime compatible with high speed optical signal responsiveness.

Having thus described our invention, what we claim as new and desire to secure by Letters Patent is:

1. In a semiconductor element exhibiting the properties of optical sensitivity, high carrier mobility and short lifetime comprising in combination
   a monocrystalline atomic arrangement substrate member having first and second essentially parallel planar major surfaces,
      said substrate having a first spacing dimension between atoms in said monocrystalline atomic arrangement,
      said substrate further having an insulating type conductivity and
   a layer of an optically sensitive semiconductor material in domain produced textured crystalline relationship with said first surface of said substrate, the atomic arrangement of the atoms of said semiconductor having a second spacing different from said first spacing in said substrate member,
      said semiconductor material layer maintaining the crystalline orientation of said substrate,
      said semiconductor layer further having crystalline domains having boundaries perpendicular with said first surface and a crystalline orientation essentially that of said substrate,
      said domain size being smaller than the diffusion length of the carriers in bulk monocrystalline material of said semiconductor.

2. A photoresponsive element comprising in combination a semiconductor element as in claim 1,
   a first transmission line conductor in ohmic contact with the exposed surface of said textured layer,
   a second transmission line conductor in ohmic contact with said exposed surface of said textured layer and separated from said first transmission line conductor by a gap,
   means exposing said exposed surface of said textured layer in said gap to a light signal,
   means providing a bias on said second transmission line conductor,
   means providing a reference or ground potential, and
   means for developing and sensing an output signal on said first transmission line conductor.

3. A signal sensing element comprising in combination
   a semiconductor element as in claim 1,
   a first transmission line conductor in ohmic contact with the exposed surface of said textured layer,
   a second transmission line conductor in ohmic contact with said exposed surface of said textured layer and separated from said first transmission line conductor by a gap,
   means impressing and developing an input signal on said first transmission line conductor,
   means providing a reference or ground potential, and
   means integrating a charge on said second transmission line conductor in the presence of an input signal.

4. The element of claim 1 where said substrate is Al$_2$O$_3$ and said semiconductor is GaAs.

5. The element of claim 4 where said layer is in a range of 0.01 to 2 microns thick.

6. The element of claim 5 where said domains are in the range of 0.1 micron to 1.0 micron.

7. In a optical signal conversion semiconductor element comprising in combination
   a layer of optically sensitive semiconductor material contiguous with and having essentially the crystalline periodicity of a monocrystalline atomically mismatched substrate and having crystal boundaries in the direction essentially orthogonal to the substrate surface defining crystalline domains that are less than the diffusion length of a carrier during the carrier lifetime in monocrystalline bulk material of said semiconductor.

8. The element of claim 7 where said semiconductor is GaAs supported by a substrate of $Al_2O_3$.

9. The element of claim 8 where said layer is 0.1 micron thick.

10. The element of claim 9 where said substrate is oriented $<0001>$ and said layer is oriented $<111>$.

* * * * *